(12) United States Patent
Chen et al.

(10) Patent No.: US 6,384,639 B1
(45) Date of Patent: May 7, 2002

(54) CIRCUIT AND METHOD FOR REDUCING STATIC POWER DISSIPATION IN A SEMICONDUCTOR DEVICE

(75) Inventors: Yi-Fan Chen, Taichung; Shou-Kong Fan, Hsin-Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/715,828

(22) Filed: Nov. 17, 2000

(51) Int. Cl.$^7$ ................................................. H03K 5/22

(52) U.S. Cl. ........................ 327/88; 326/112; 327/530

(58) Field of Search ............................... 326/104, 112, 326/119, 120, 121, 122; 327/77, 530, 80, 81, 85, 88, 89

(56) References Cited

U.S. PATENT DOCUMENTS

| | | | | |
|---|---|---|---|---|
| 5,315,549 A | * | 5/1994 | Scherpenberg et al. | 365/189.09 |
| 5,883,528 A | * | 3/1999 | Kashmiri et al. | 326/71 |
| 6,100,751 A | * | 8/2000 | De et al. | 327/534 |
| 6,124,737 A | * | 9/2000 | Lan et al. | 326/121 |
| 6,211,725 B1 | * | 4/2001 | Kang | 327/534 |

* cited by examiner

Primary Examiner—Jeffrey Zweizig
(74) Attorney, Agent, or Firm—Powell, Goldstein, Frazer & Murphy

(57) ABSTRACT

A method for reducing static power dissipation in a semiconductor device is provided. The method is characterized in that utilizing a simple control device connecting with a MOS device, serving for a drain voltage controller, instead of the conventional voltage supply directly connected with the drain. The control device comprises two input terminals and an output terminal. One of the two input terminals is connected with a voltage supply, the other of the two input terminals is connected with a control signal. The output terminal of the control device is connected to the drain of the MOS device. When the control signal is activated, the output terminal of the control device is grounded and thus the drain is grounded. Thereby, all of the possible leakage paths induced by the drain voltage are inhibited. While the control signal is un-activated, the output terminal of the control device provides a supply voltage to the drain. The present invention uses a simple control device to reduce static power dissipation in a MOS device, which is contributed from the leakage paths induced by the drain voltage, by turning off the drain power supply voltage when the MOS device is during a sleep mode.

9 Claims, 2 Drawing Sheets

CIRCUIT AND METHOD FOR REDUCING STATIC POWER DISSIPATION IN A SEMICONDUCTOR DEVICE

BACKGROUND OF THE INVENTION

1. Field of the Invention

The present invention relates to a method for reducing static power dissipation in a semiconductor device, and more particularly to a method for reducing static power dissipation in a semiconductor device by turning off a power supply voltage when the device is during a sleep mode.

2. Description of the Prior Art

The metal-oxide-semiconductor (MOS) transistor is a primary device formed in a semiconductor substrate, as shown in FIG. 1, a N type MOS transistor 12 formed on P type substrate 10. In general, a power voltage Vcc is supplied to the drain 14 of the NMOS transistor 12, and the source 16 of the NMOS transistor 12 is grounded. When a voltage larger than the threshold voltage $V_{th}$ is supplied to the gate of the NMOS transistor 12, the NMOS transistor 12 is turned on, and then there is electrical conductance between the drain 14 and the source 16. That is, a current flow occurs from the drain 14 to the source 16. However, referring to FIG. 1, even though the NMOS transistor 12 is turned off, due to the gate voltage less than $V_{th}$, the drain voltage Vcc also induce some kinds of leakage paths. For example, the possible leakage paths can be subthreshold current, the direct oxide tunneling current $I_{11}$, the drain-induced barrier lowering current (DIBL) $I_{12}$, and the drain to substrate p-n junction current $I_{13}$. All of the leakage paths induced by the drain voltage generate static power dissipation $I_{leakage} \times V_{DD}$ when the NMOS transistor 12 is during a sleep mode.

Traditionally, the measure to reduce the static power dissipation of the semiconductor device is by way of eliminating/or blocking the leakage paths. For example, utilizing a high-K material to increase the thickness of the gate isolating layer to reduce the tunneling current of the gate isolating layer, and using the substrate back bias to control the subthreshold leakage. Most of the traditional measures use the process technique and/or control circuit to reduce the leakage currents. Therefore, the present invention provides a new concept to decrease the static power dissipation from a voltage source Vcc.

SUMMARY OF THE INVENTION

It is one object of the present invention to provide a method for reducing static power dissipation in a semiconductor device, in which a simple control device is used to connect with the semiconductor device through an output terminal of the control device, and serving for a power voltage supply controller. During a sleep mode of the semiconductor device, the output terminal of the control device is grounded and thus there is no power voltage supplied to the semiconductor device. Thereby, the static power dissipation of the semiconductor device is reduced by way of turning off the power voltage supply during the sleep mode.

It is another object of the present invention to provide a method for reducing static power dissipation in a semiconductor device, in which a control device having two input terminals and one output terminal is provided. One of the two input terminals is connected with a voltage supply, the other of the two input terminals is connected with a control signal. The output terminal of the control device is connected to a drain of a MOS transistor. When the MOS transistor is in sleep mode, the control signal is activated and the output terminal is grounded, and thus the drain is grounded. And then, all of the possible leakage paths induced by the drain voltage are inhibited, which contribute to the static power dissipation of the MOS transistor. Therefore, the static power dissipation of the MOS transistor during non-working state is eliminated by this means.

In order to achieve the above objects, the present invention provides a method for reducing static power dissipation in a semiconductor device, in which a control device having two input terminals and one output terminal is provided. One of the two input terminals is connected with a voltage supply, the other of the input terminals is connected with a control signal. The output terminal of the control device is connected to a drain of a metal-oxide-semiconductor (MOS) device. When the control signal is activated, the output terminal of the control device is grounded and thus the drain of the MOS device is grounded. Thereby, all of the possible leakage paths induced by the drain voltage are inhibited. When the control signal is un-activated, the output terminal of the control device provides a supply voltage to the drain of the MOS device, and then the MOS device is in a normal state. While, the static power dissipation of the MOS device, contributed from the leakage paths induced by the drain voltage, is reduced, by turning off the drain voltage supply during a sleep mode of the MOS device.

BRIEF DESCRIPTION OF THE DRAWINGS

The present invention can be best understood through the following description and accompanying drawings wherein.

DESCRIPTION OF THE PREFERRED EMBODIMENT

Figure 1:
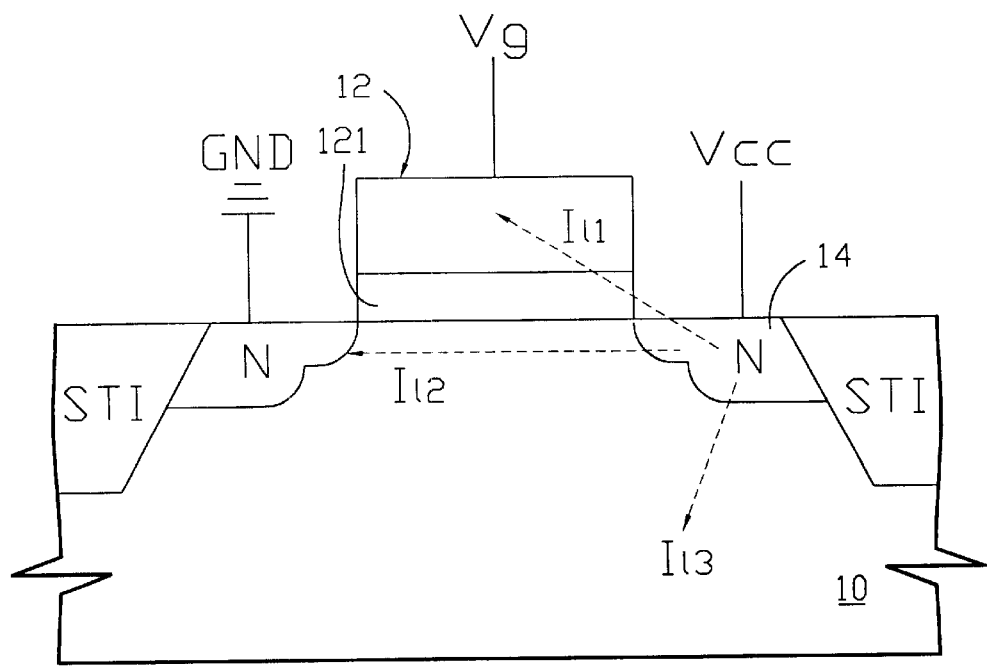
FIG. 1 depicts all the possible leakage paths induced by a drain voltage Vcc, generally occurred in a conventional MOS device.
Figure 2:
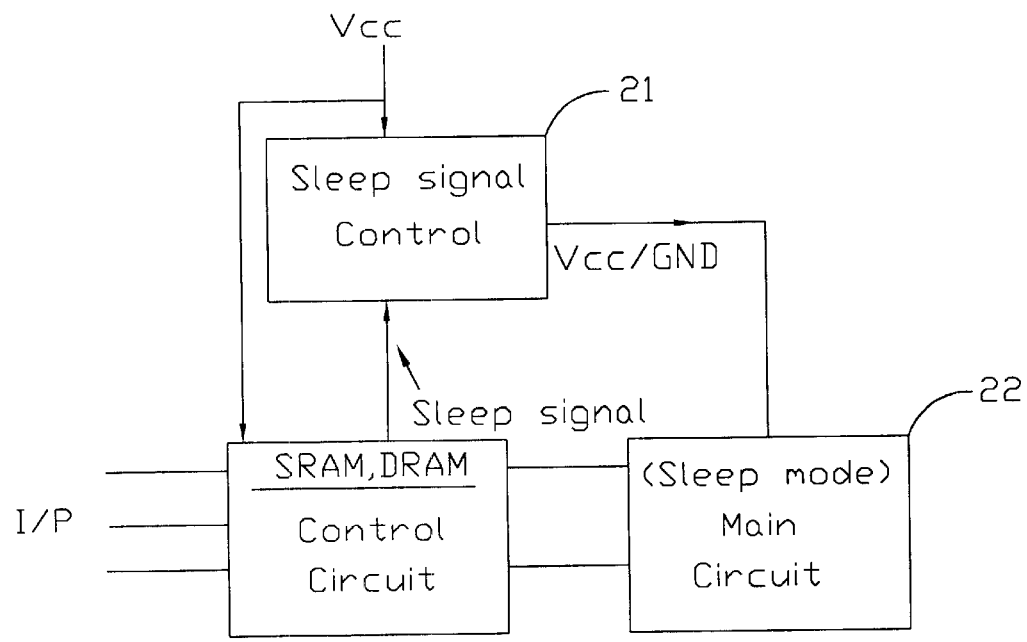
FIG. 2 is a block diagram of the present invention, showing that utilizing a sleep signal control device to control a power voltage supply Vcc, wherein the sleep signal control device turns off the power voltage supply Vcc when the main circuit is during a sleep mode.

FIG. 2 is a block diagram according to the present invention, showing that a control device, such as a sleep signal voltage control 21, is used to serve as a power voltage supply Vcc of main circuit 22, instead of a conventional power voltage supply Vcc directly connected with the main circuit 22. When the main circuit 22 is in a sleep mode, for example, a standby state, the sleep signal voltage control 21 receives a sleep signal and is turned off, and thus there is no power voltage Vcc supplied to the main circuit 22. As a result, the static power dissipation of the main circuit 22 is reduced.

Figure 3:
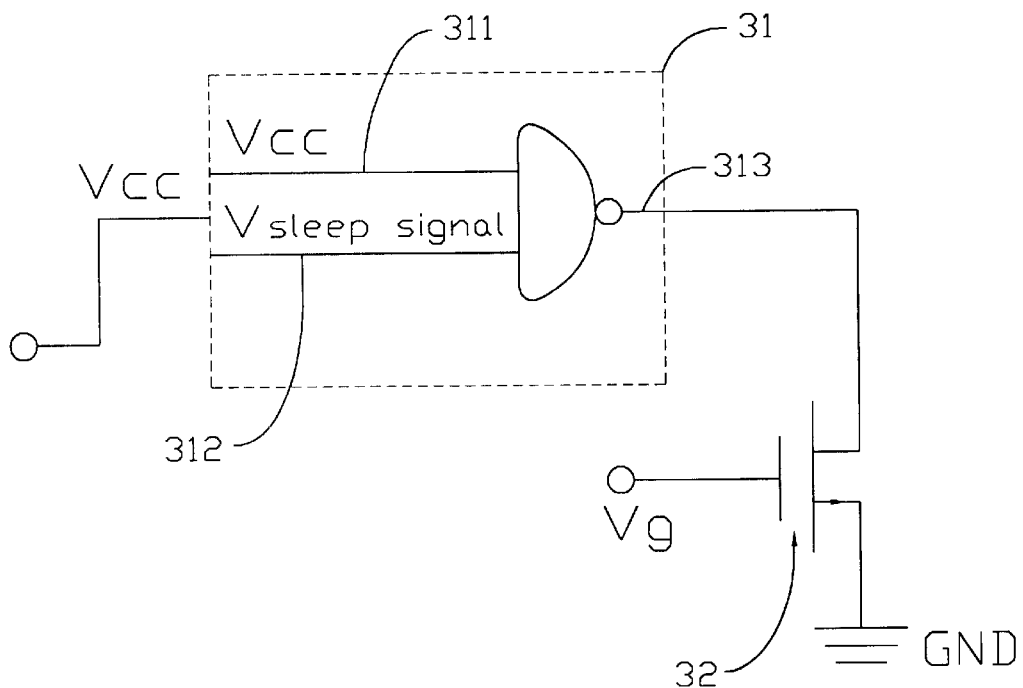
FIG. 3 is a circuit diagram according to one embodiment of the present invention.
Figures 4A, 4B:
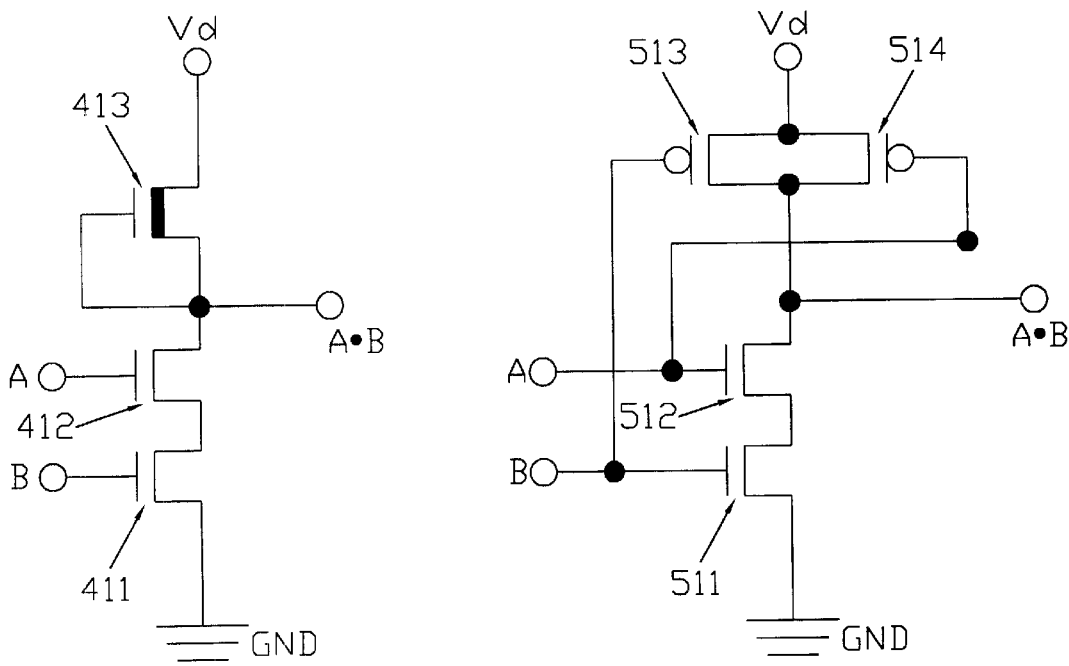
FIG. 4A and FIG. 4B respectively shows a variant of a control device utilized in the embodiment of the present invention.

FIG. 3 is a preferred embodiment of this invention. A control device 31 having two input terminals 311, 312 and one output terminal 313, is connected with a metal-oxide-semiconductor device 32, for example, a N type MOS transistor or a P type MOS transistor. The input terminal 311 is connected with a voltage supply Vcc, and the input terminal 312 is connected with a control signal, such as, a sleep signal control signal $V_{sleep\ signal}$. The output terminal 313 of the control device 31 is connected with a drain of the MOS device 32, and serving for a power voltage supply controller. The control device 31 can be a Not-AND Gate (NAND gate), for example, as shown in FIG. 4A, made up of two Enhancement Mode NMOS transistors 411 and 412 and one Depletion Mode NMOS transistor 413. The two Enhancement Mode NMOS transistors 411 and 412 are connected in series, and respectively served as the two input terminals of the control device 31, one connected with the voltage supply Vcc, the other connected with the control signal. While the Depletion Mode NMOS transistor 413 serves as a loading, which is turned on at any time. Since the two NMOS transistors 411 and 412 are connected in series, only both of them are turned on, i.e., the control signal connected therewith is activated, the NMOS transistor 413 is grounded, and then the output A-B serving for the output terminal 313 of the control device 31 is grounded. Thereby, there is no power voltage supplied to the drain of the MOS device 32, and all of the possible leakage paths, such as subthreshold leakage, direct oxide tunneling, drain to substrate p-n junction current and the like, induced by the drain voltage of the MOS device 32 are inhibited. And thus, the static power dissipation of the MOS device 32 contributed from the leakage paths is reduced. When only one of the two NMOS transistors 411 and 412 is turned on, i.e., the control signal connected therewith is not activated, the output A·B of the NAND gate feeds a voltage Vcc to the drain of the MOS device 32.

FIG. 4B is an alternative of the NAND gate used as the control device 31, which is made up of two CMOS transistors. The two NMOS transistors 511 and 512 are connected in series, and respectively served as the two input terminals of the control device 31, while the two PMOS transistors 513 and 514 are connected in parallel and respectively served as a loading. When both of the NMOS transistors 511 and 512, respectively serving for the two input terminals of the control device 31, are turned on, the output A·B is grounded, and then there is no power voltage supplied to the MOS device 32. While only one of the two NMOS transistors 511 and 512 is turned on, and then one of the two PMOS transistors 513 and 514 is turned on. Thus, the output A·B feeds a power voltage Vcc to the drain of the MOS device 32. Therefore, the static power dissipation of the MOS device 32 contributed from the leakage paths induced by the drain voltage is reduced during a sleep mode due to no power voltage supplied to the drain of the MOS device 32.

The preferred embodiment is only used to illustrate the present invention, not intended to limit the scope thereof. Many modifications of the preferred embodiment can be made without departing from the spirit of the present invention.

What is claimed is:

1. A method for reducing static power dissipation in a semiconductor device, said method comprising:

providing a supply voltage and a control signal;

connecting said supply voltage to a power source input terminal of said semiconductor device when said control signal is un-activated; and interrupting said supply voltage and generating a ground voltage to said power source input terminal of said semiconductor device when said control signal is activated;

wherein said supply voltage is interrupted or connected to said power source input terminal of said semiconductor device depending on said control signal and said supply voltage, and is determined by a Not-AND logic (NAND logic).

2. The method of claim 1, wherein said Not-AND logic is performed by a Not-AND gate (NAND gate).

3. The method of claim 2, wherein said Not-AND gate is made up of two Enhancement Mode NMOS transistors respectively serving as two input terminals and one Depletion Mode NMOS transistor serving as a loading.

4. The method of claim 2, wherein said Not-AND gate is made up of two CMOS transistors, two NMOS transistors of said two CMOS transistors connected in series and respectively serving as two input terminals, while two PMOS transistors of said two CMOS transistors connected in parallel and respectively serving as a loading.

5. A circuit arrangement for reducing static power dissipation in a semiconductor device, said circuit arrangement comprising:

a control unit formed of a Not-AND gate having two input terminals and one output terminal, one of said two input terminals connected with a voltage supply, the other of said two input terminals connected with a control signal; and a MOS device, a drain of said MOS device connected to said output terminal of said control unit;

wherein when said control signal is activated, said output terminal is grounded and thus said drain of said MOS device is grounded, while said control signal is un-activated, said output terminal provides a supply voltage to said drain of said MOS device.

6. The circuit arrangement of claim 5, wherein said Not-AND gate is made up of two Enhancement Mode NMOS transistors respectively serving as two input terminals and one Depletion Mode NMOS transistor serving as a loading.

7. The circuit arrangement of claim 5, wherein said Not-AND gate is made up of two CMOS transistors, two NMOS transistors of said two CMOS transistors connected in series and respectively serving as two input terminals, while two PMOS transistors of said two CMOS transistors connected in parallel and respectively serving as a loading.

8. The circuit arrangement of claim 5, wherein said MOS device is an N type MOS transistor.

9. The circuit arrangement of claim 5, wherein said MOS device is a P type MOS transistor.

* * * * *